(12) United States Patent
Park

(10) Patent No.: US 8,771,031 B2
(45) Date of Patent: Jul. 8, 2014

(54) METHOD OF MANUFACTURING ORGANIC LIGHT-EMITTING DISPLAY APPARATUS AND ENCAPSULATION SHEET USED IN THE METHOD

(75) Inventor: Seung-Kyu Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 314 days.

(21) Appl. No.: 13/312,063

(22) Filed: Dec. 6, 2011

(65) Prior Publication Data

US 2012/0262058 A1 Oct. 18, 2012

(30) Foreign Application Priority Data

Apr. 12, 2011 (KR) .................. 10-2011-0033775

(51) Int. Cl.
*H01J 9/00* (2006.01)
(52) U.S. Cl.
USPC .............................. 445/66; 445/23; 349/106
(58) Field of Classification Search
None
See application file for complete search history.

(56) References Cited

U.S. PATENT DOCUMENTS

| 7,545,094 | B2 * | 6/2009 | Choi et al. | 313/504 |
| 2007/0170861 | A1 * | 7/2007 | Lee et al. | 313/512 |
| 2007/0196949 | A1 * | 8/2007 | Lee | 438/99 |
| 2008/0238302 | A1 * | 10/2008 | Sung et al. | 313/504 |

FOREIGN PATENT DOCUMENTS

| KR | 10-2008-0088031 | 10/2008 |
| KR | 10-2009-0030704 A | 3/2009 |

* cited by examiner

*Primary Examiner* — Ashok Patel
(74) *Attorney, Agent, or Firm* — Christie, Parker & Hale, LLP

(57) ABSTRACT

A method of manufacturing an organic light-emitting display apparatus includes: preparing a substrate including a display unit and peripheral parts; forming a cutting line on an encapsulation sheet to correspond to a boundary line between the display unit and the peripheral parts, wherein a size of the encapsulation sheet corresponds to that of the substrate; adhering the substrate and the encapsulation sheet together; removing the peripheral parts of the substrate; and cutting the encapsulation sheet along the cutting line. According to the method, a step height is not generated between the substrate and the encapsulation sheet when cutting the substrate and thus cracks may be avoided. Accordingly, products may be stably produced.

7 Claims, 6 Drawing Sheets

METHOD OF MANUFACTURING ORGANIC LIGHT-EMITTING DISPLAY APPARATUS AND ENCAPSULATION SHEET USED IN THE METHOD

CROSS-REFERENCE TO RELATED PATENT APPLICATION

This application claims priority to and the benefit of Korean Patent Application No. 10-2011-0033775, filed on Apr. 12, 2011, in the Korean Intellectual Property Office, the disclosure of which is incorporated herein in its entirety by reference.

BACKGROUND

1. Field

Aspects of embodiments according to the present invention relate to a method of manufacturing an organic light-emitting display apparatus and an encapsulation sheet used in the method.

2. Description of the Related Art

In general, in organic light-emitting display apparatuses, a display unit, which displays an image, is formed on a substrate, and an encapsulation sheet covers and protects the display unit.

In this structure, the display unit is formed on the substrate. Then, a bonding process, in which the substrate is bonded to the encapsulation sheet so as to seal the display unit, and a cutting process, in which a residue (e.g., a portion not bonded to the encapsulation sheet) at the periphery or circumference of the substrate is cut according to a product standard after the bonding, are performed.

However, when sizes of the substrate and the encapsulation sheet are different from each other and thus resulting in a step height, a crack may be generated in the substrate during the cutting process. That is, in general, in cutting a substrate, an encapsulation sheet functions as a support that opposes a force exerted during the cutting from the opposite side. However, the periphery of the substrate protrudes from the circumference of the encapsulation sheet when the size of the encapsulation sheet is smaller than that of the substrate, and thus, the periphery of the substrate is not supported by the encapsulation sheet. Accordingly, stress is concentrated on the step height during the cutting, and thus a crack may be easily generated in the substrate. Consequently, products may not be stably produced and there is a need for a solution to this problem.

SUMMARY

Aspects of embodiments according to the present invention are directed toward a method of manufacturing an improved organic light-emitting display apparatus, so that cracks may be suppressed from forming during bonding and cutting of a substrate and an encapsulation sheet, and the encapsulation sheet used in the method.

According to an embodiment of the present invention, there is provided a method of manufacturing an organic light-emitting display apparatus including: preparing a substrate including a display unit and peripheral parts surrounding the display unit; forming a cutting line on an encapsulation sheet to correspond to a boundary line between the display unit and the peripheral parts, wherein a size of the encapsulation sheet corresponds to that of the substrate; adhering the substrate and the encapsulation sheet together; removing the peripheral parts of the substrate; and cutting the encapsulation sheet along the cutting line.

The encapsulation sheet may include an insulating base film and metal wirings on at least one surface of the base film so as to form a conductive path connecting the display unit and a power source.

The metal wirings may be completely removed at the cutting line and the base film may be partially punched.

The metal wirings may be completely removed at the cutting line and the base film may not be punched.

The metal wirings and the base film may be all partially punched at the cutting line.

The substrate may include a plurality of cells, each of the cells including the display unit and the cutting line surrounding the display unit.

According to another embodiment of the present invention, there is provided an encapsulation sheet adhered to a substrate including a display unit encapsulated by the encapsulation sheet, the encapsulation sheet including: an insulating base film; metal wirings on both surfaces of the insulating base film forming a conductive path for connecting the display unit to a power source; and a cutting line surrounding the display unit.

The metal wirings may be completely removed at the cutting line and the base film may be partially punched.

The metal wirings may be completely removed at the cutting line and the base film may not be punched.

The metal wirings and the base film may be all partially punched at the cutting line.

According to the method of manufacturing an organic light-emitting display apparatus, a step height is not generated between the substrate and the encapsulation sheet when cutting the substrate, and thus fewer cracks are generated. Accordingly, products may be stably produced.

BRIEF DESCRIPTION OF THE DRAWINGS

The above and other features and aspects of the present invention will become more apparent by describing in detail exemplary embodiments thereof with reference to the attached drawings in which:

FIGS. 2A through 2D illustrate a manufacturing method of the organic light-emitting display apparatus of FIG. 1, according to an embodiment of the present invention, wherein FIG. 2B is a cross-sectional view of the organic light-emitting display apparatus of FIG. 1, taken along the line A-A of FIG. 2A;

FIGS. 3A and 3B illustrate a manufacturing method of an organic light-emitting display apparatus, according to another embodiment of the present invention, wherein FIG. 3B is a cross-sectional view of the organic light-emitting display apparatus taken along the line B-B of FIG. 3A;

FIGS. 4A and 4B illustrate a manufacturing method of an organic light-emitting display apparatus, according to another embodiment of the present invention, wherein FIG. 4B is a cross-sectional view of the organic light-emitting display apparatus taken along the line C-C of FIG. 4A.

Figure 5A:
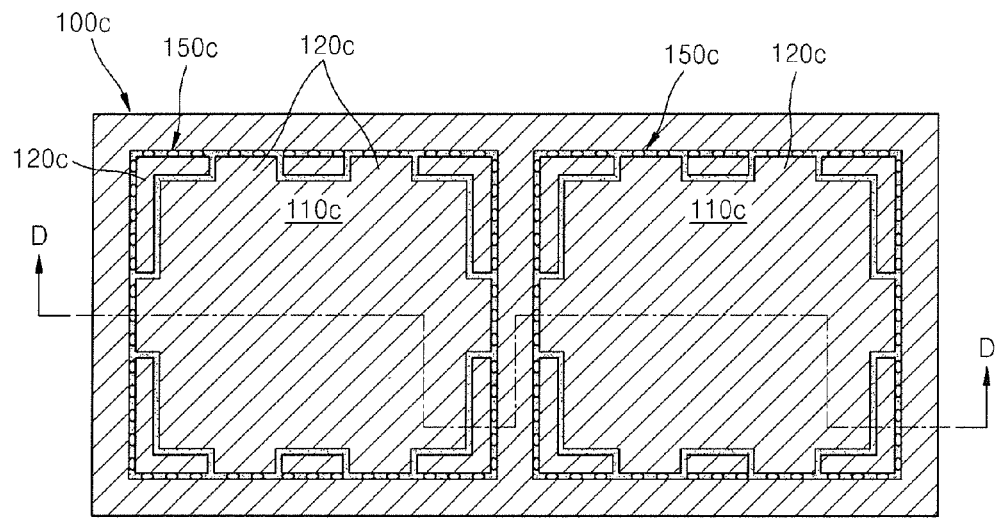
FIGS. 5A and 5B illustrate a manufacturing method of an organic light-emitting display apparatus, according to another embodiment of the present invention, wherein FIG.

5B is a cross-sectional view of the organic light-emitting display apparatus taken along the line D-D of FIG. 5A.

DETAILED DESCRIPTION

Hereinafter, one or more embodiments of the present invention will be described in detail with reference to the accompanying drawings.

The present invention may, however, be embodied in many different forms and should not be construed as being limited to the embodiments set forth herein. For clearly describing the present invention, any detail which is not related to the description is omitted. In the drawings, the sizes and thicknesses of elements may be exaggerated for clarity.

Figure 1:
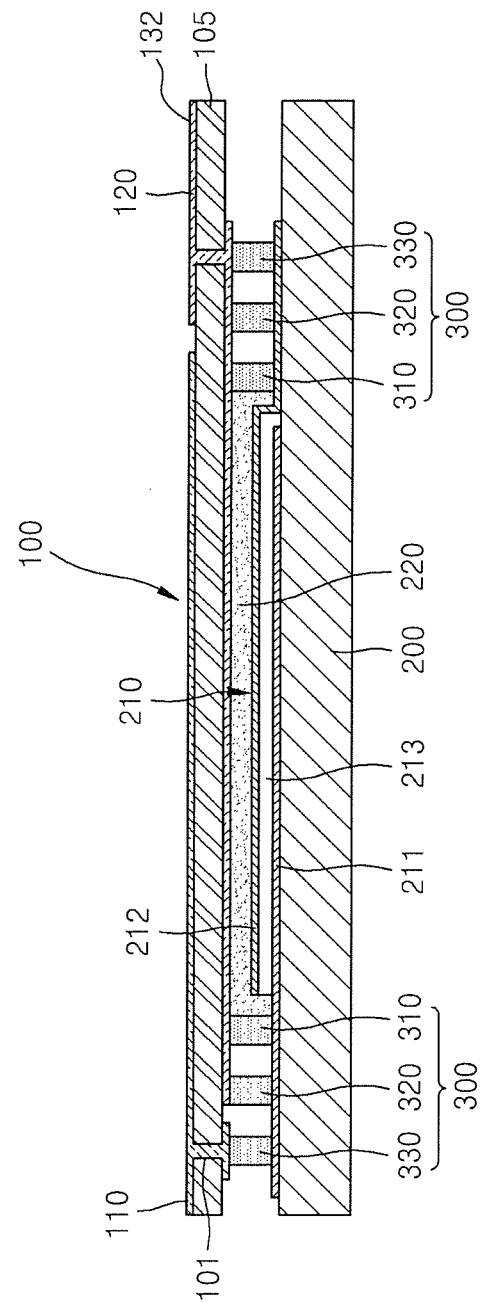
FIG. 1 is a cross-sectional view of an organic light-emitting display apparatus manufactured by using a manufacturing method according to an embodiment of the present invention.

FIG. 1 is a cross-sectional view of an organic light-emitting display apparatus manufactured by using a manufacturing method according to an embodiment of the present invention.

Referring to FIG. 1, the organic light-emitting display apparatus includes a substrate 200, on which a display unit 210 is formed, and an encapsulation sheet 100 as an encapsulation member to cover and protect the display unit 210.

The substrate 200 may be a glass substrate or a transparent polymer substrate, and light emitted from the display unit 210 penetrates the substrate 200 to be emitted to the outside.

The display unit 210 includes a light emission layer 213, and a first electrode 211 and a second electrode 212 that are disposed to face each other with the light emission layer 213 interposed therebetween. When a voltage is applied across the first electrode 211 and the second electrode 212, and thus an appropriate voltage condition is established between the two electrodes, namely, the first and second electrodes 211 and 212, and light is emitted from the light emission layer 213.

For convenience of description, the first and second electrodes 211 and 212 are schematically illustrated. However, the first electrode 211 includes a pixel electrode (not illustrated) disposed below the light emission layer 213 and a conductor line (not illustrated) connected to the pixel electrode through source/drain electrodes of a transistor (not illustrated), and the second electrode 212 includes an opposite electrode (not illustrated) disposed above the light emission layer 213 and a conductor line (not illustrated) connected to the opposite electrode (not illustrated). That is, the first electrode 211 is an electrode unit that supplies an anode voltage to one side of the light emission layer 213 on the substrate 200, and the second electrode 212 is an electrode unit that supplies a cathode voltage to the other side of the light emission layer 213.

Also, similar to a general organic light-emitting display apparatus, the display unit 210 includes a gate wiring (not illustrated) for transmitting a scan signal to each pixel of the display unit and a data wiring (not illustrated) for transmitting a data signal to each pixel.

A first wiring 110 for transmitting an anode voltage (hereinafter, referred to as Vdd voltage) applied from the outside to the first electrode 211 and a second wiring 120 for transmitting a cathode voltage (hereinafter, referred to as Vss voltage) applied from the outside to the second electrode 212, are disposed in the encapsulation sheet 100, instead of the substrate 200. Then, the first and second wirings 110 and 120 and the gate and data wirings are disposed on the encapsulation sheet 100 and the substrate 200, respectively, that are spaced apart from each other by a few millimeters (mm) or more with the display unit 210 interposed therebetween. Thus, a problem of a capacitance load occurring, since the number of electric wirings are concentrated on the substrate 200 and are overlapped within a few micrometers (μm), may be resolved.

The display unit 210 is surrounded by a sealing layer 300 disposed on the substrate 200, wherein the sealing layer 300 includes a getter layer 310, an adhesive layer 320, and a conductive adhesive layer 330.

The getter layer 310, the adhesive layer 320, and the conductive adhesive layer 330 may be formed by coating a liquid or a paste-like material on the substrate 200 using a dispenser or a screen printer and drying the coated liquid or paste-like material.

The getter layer 310 includes a getter material that absorbs moisture and oxygen. Examples of the getter material may include barium oxide, calcium oxide, magnesium oxide, lithium oxide, sodium oxide, potassium oxide, lithium sulfate, sodium sulfate, calcium sulfate, magnesium sulfate, potassium sulfate, potassium chlorate, magnesium chloride, calcium bromide, cesium bromide, vanadium bromide, and calcium nitrate. The getter layer 310 is disposed closest to the display unit 210 compared to the adhesive layer 320 and the conductive adhesive layer 330, and thus suppresses moisture and oxygen from penetrating the display unit 210.

The adhesive layer 320 is disposed outside of the getter layer 310, and the conductive adhesive layer 330 is disposed outside of the adhesive layer 320. The adhesive layer 320 and the conductive adhesive layer 330 include a UV curing type resin or a thermosetting resin, wherein the thermosetting resin may include, for example, an epoxy resin.

The conductive adhesive layer 330 is conductive in a thickness direction of the substrate 200 (a vertical direction in FIG. 1) and is insulative in directions other than the thickness direction.

As such, the sealing layer 300 protects the display unit 210 by surrounding the display unit 210 with three layers. In the sealing layer 300, the getter layer 310 removes moisture and oxygen, the adhesive layer 320 adheres the substrate 200 and the encapsulation sheet 100, the conductive adhesive layer 330 electrically connects the first and second wirings 110 and 120 of the encapsulation sheet 100 respectively to the first and second electrodes 211 and 212 of the substrate 200, in addition to providing an adhesive function.

Next, the structure of the encapsulation sheet 100 is described.

Referring to FIG. 1, the encapsulation sheet 100 includes an insulating base film 105 and the metal wirings 110 and 120 formed on both surfaces of the base film 105 so as to constitute a conductive path.

The base film 105 may include a polymer material having a low penetration ratio of moisture to oxygen, for example, polyethylene terephthalate, polyethylene naphthalate, polyimide, or polycarbonate with a thickness between about 1 μm and about 300 μm.

The metal wirings 110 and 120 form an inorganic layer through which moisture and oxygen does not penetrate and which encapsulates the display unit 210 along with the adhesive layer 320. Also, the metal wirings 110 and 120 function as electric wirings that apply electric signals to the first and second electrodes 211 and 212 of the display unit 210, in addition to an encapsulation function.

The metal wirings 110 and 120 include the first wiring 110 connected to the first electrode 211 of the display unit 210 and the second wiring 120 connected to the second electrode 212, wherein the first and second wirings 110 and 120 extend on both surfaces of the base film 105 through a penetration hole 101 formed in the base film 105. That is, each of the first and second wirings 110 and 120 extends from one surface of the base film 105 to the other surface of the base film 105 through the penetration hole 101. The first wiring 110 and the second wiring 120 are insulated from each other by the insulating base film 105.

Accordingly, an electric signal through the first wiring 110 (e.g., the Vdd voltage) is transmitted to the first electrode 211 of the display unit 210 through the conductive adhesive layer 330, and an electric signal through the second wiring 120 (e.g., the Vss voltage) is transmitted to the second electrode 212 of the display unit 210 through the conductive adhesive layer 330. The first and second wirings 110 and 120 may include aluminum (Al), copper (Cu), or combinations thereof.

Reference numeral 220 denotes a moisture absorbent.

The organic light-emitting display apparatus of FIG. 1 may be manufactured as described next with reference to FIGS. 2A through 2D.

Figure 2A:
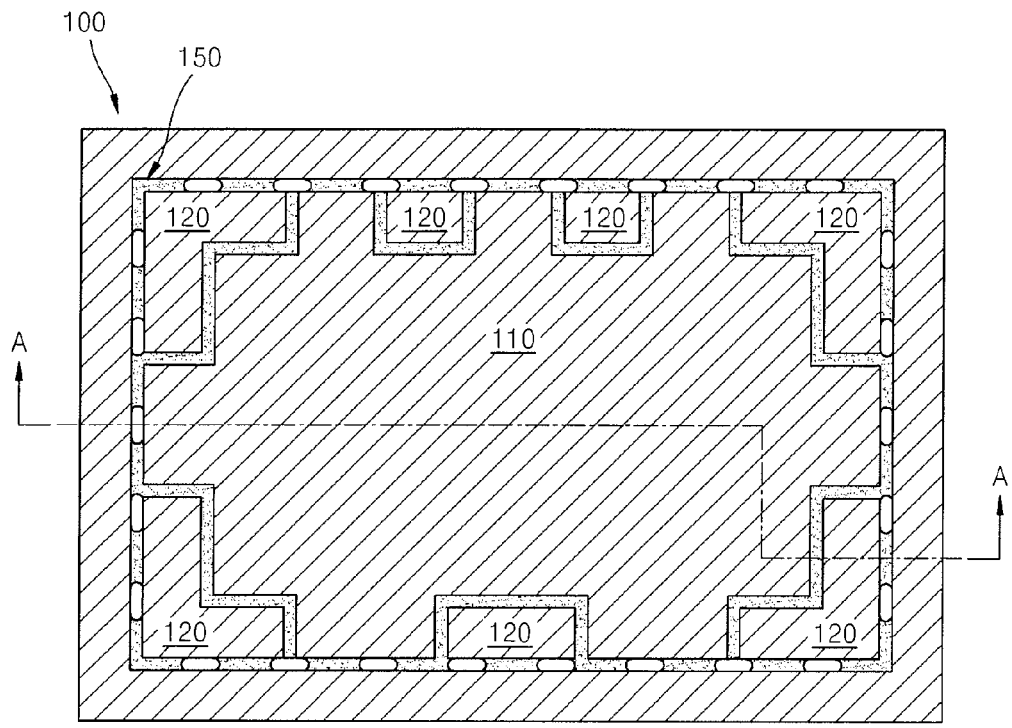
Figure 2B:
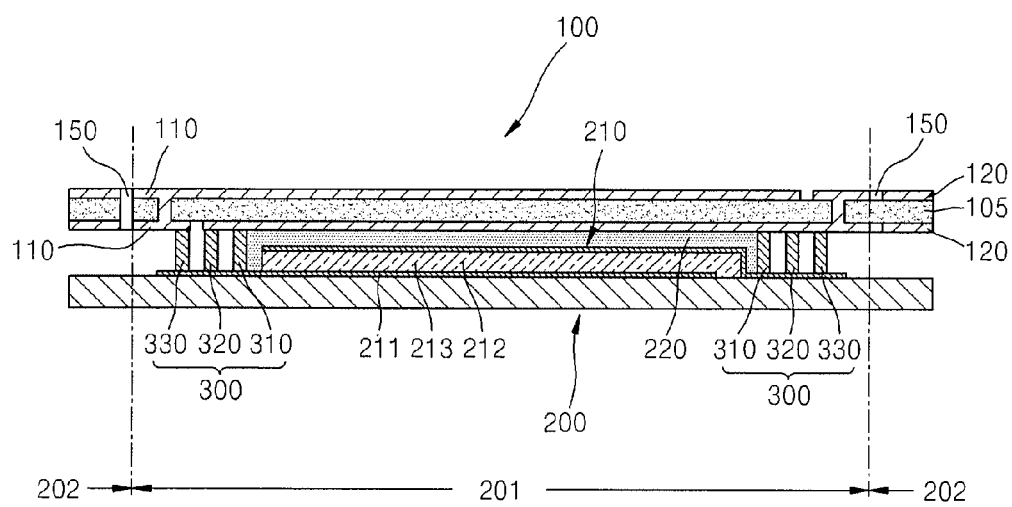

As described in FIGS. 2A and 2B, the substrate 200, on which the display unit 210 is formed, and the encapsulation sheet 100 used to cover the display unit 210 are prepared and are adhered to each other with the sealing layer 300. FIG. 2A is a plan view of the encapsulation sheet 100, illustrating that the encapsulation sheet 100 and the substrate 200 are adhered to each other, and FIG. 2B is a cross-sectional view of the organic light-emitting display apparatus taken along the line A-A of FIG. 2A.

The substrate 200, when firstly adhered, includes a center part 201, which includes the display unit 210, and peripheral parts 202 at outer sides. The peripheral parts 202 are dummy units which are not part of a product standard and are cut later.

The encapsulation sheet 100 is formed to have substantially the same size as the substrate 200 including the peripheral parts 202, and is adhered to the substrate 200. The encapsulation sheet 100 includes a cutting line 150, which corresponds to a boundary line of the center part 201 and the peripheral parts 202. As the peripheral parts 202 of the substrate 200 are cut later, parts outside of the cutting line 150 on the encapsulation sheet 100 are removed later. In an embodiment of the present invention, the cutting line 150 is formed by removing the metal wirings 110 and 120 disposed on both surfaces of the encapsulation sheet 100 and punching at various places in the base film 105. That is, the metal wirings 110 and 120 are removed in the form of a notch groove along a location on which the cutting line 150 is to be formed, and thereby the exposed base film 105 is partially punched so that the base film 105 may be easily cut later.

Figure 2C:
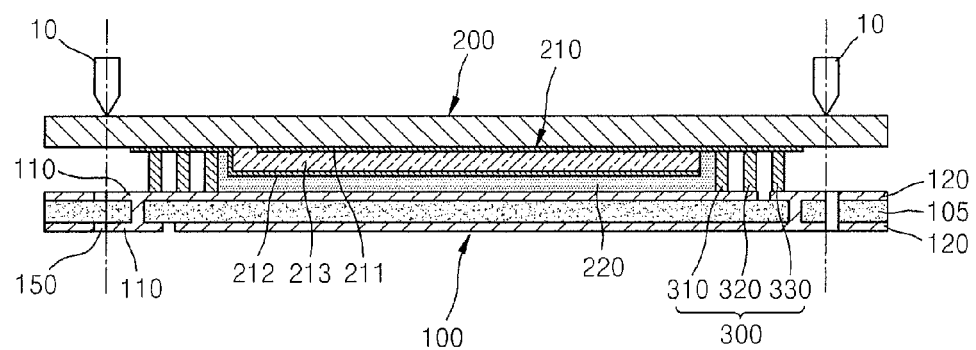

After the substrate 200 and the encapsulation sheet 100 are adhered to each other, the peripheral parts 202 of the substrate 200 are cut by using a cutting tool 10, as illustrated in FIG. 2C. Here, the encapsulation sheet 100 functions as a support from a side opposite the side where a cutting force is applied so as to oppose the cutting force. As illustrated in FIG. 2C, the sizes of the substrate 200 and the encapsulation sheet 100 are substantially the same as each other. Therefore, a step height is not generated between the substrate 200 and the encapsulation sheet 100, and thus cracks that are generally generated by stress that is concentrated on a step unit may not be generated in the substrate 200 of the present embodiment.

Figure 2D:
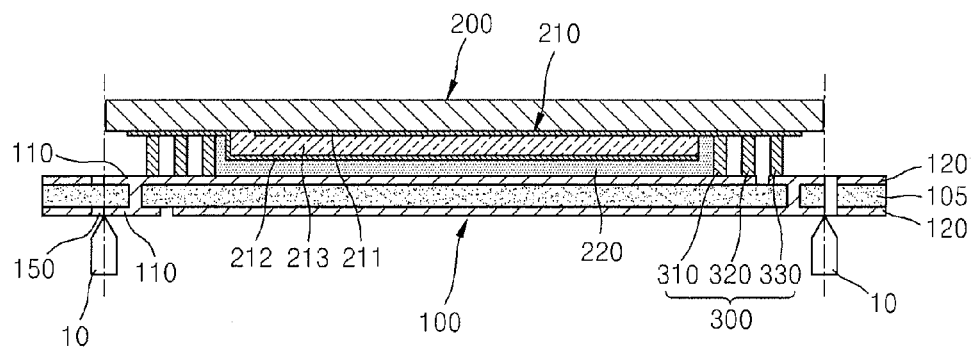

As such, after the peripheral parts 202 of the substrate 200 are cut, the cutting tool 10 is used to cut the encapsulation sheet 100 along the cutting line 150, as illustrated in FIG. 2D. As described above, the cutting line 150 is previously made to facilitate cutting of the encapsulation sheet 100 so that the encapsulation sheet 100 may be easily cut using a significantly small force compared with that of cutting the substrate 200.

As described above, when dummy units at the peripheral portions of the substrate 200 and the encapsulation sheet 100 are removed, the organic light-emitting display apparatus as shown in FIG. 1 may be obtained according to a product standard.

Accordingly, when the peripheral parts 202 of the substrate 200 are cut, the encapsulation sheet 100 having substantially the same size as the substrate 200 provides support at the side opposite the side applied with the cutting force, and thus the peripheral parts 202 of the substrate 200 may be stably cut. Also, when the dummy units at the peripheral portions of the encapsulation sheet 100 are cut, the cutting line 150, which is previously made, may reduce the cutting force. Thus, cracks may not be generated in the substrate 200 during cutting.

The cutting line 150 may be formed on the encapsulation sheet 100 in various ways as illustrated in FIGS. 3A through 5B.

Figure 3A:
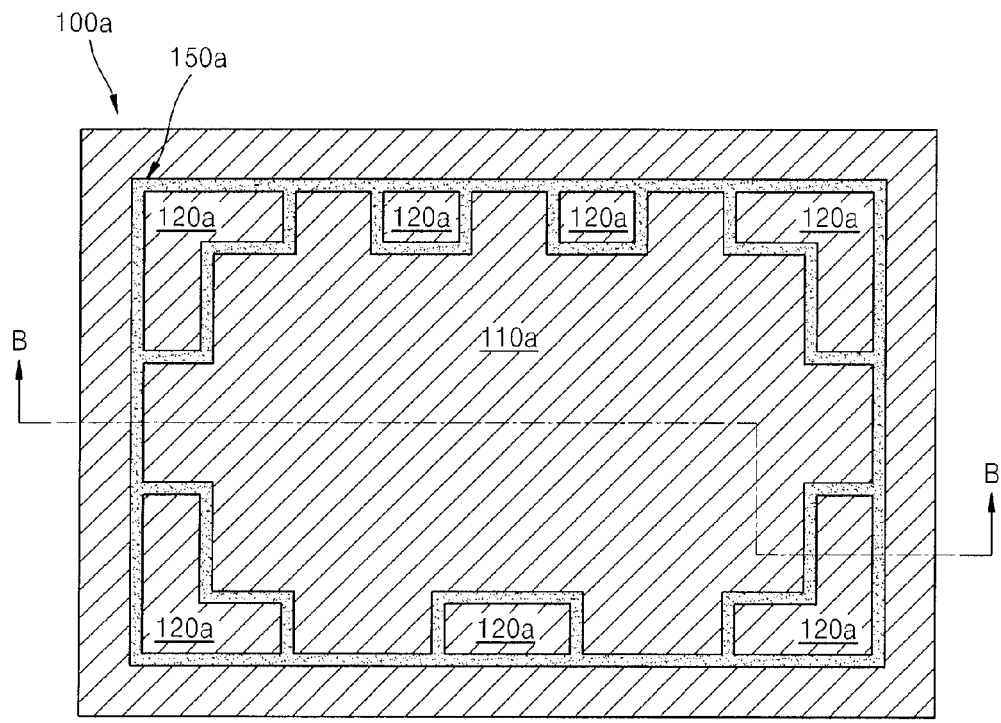
Figure 3B:
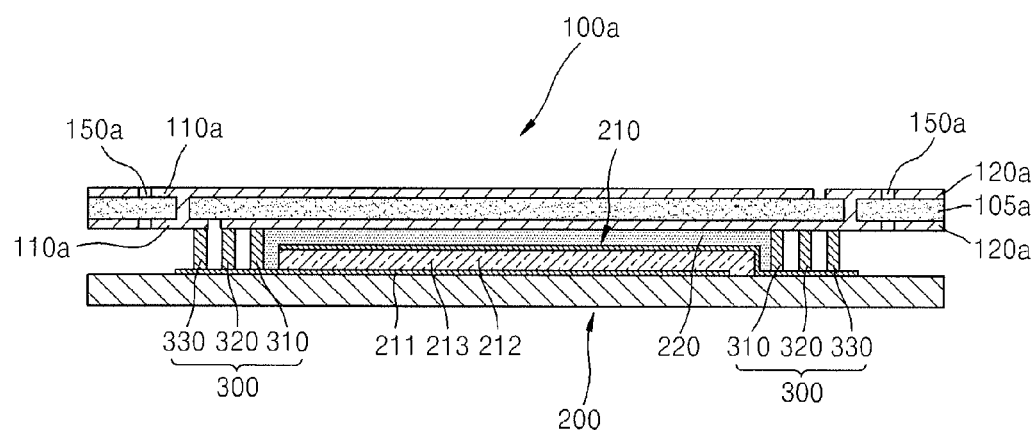

Referring to FIGS. 3A and 3B, as described above, metal wirings 110a and 120a are formed on both surfaces of a base film 105a, and an encapsulation sheet 100a includes a cutting line 150a at the periphery of the encapsulation sheet 100a. In FIGS. 3A and 3B, like reference numerals in the previous embodiments denote like elements. Here, the metal wirings 110a and 120a are removed using the cutting line 150a in the form of a notch groove, and thus the exposed base film 105a is not punched. That is, in the previous embodiment, the base film 105 is partially punched to form the cutting line 150, whereas in the current embodiment, the base film 105a is not touched and metal wirings 110a and 120a on both surfaces of the base film 105a and along a location on which the cutting line 150 is to be formed are removed only to form the cutting line 150a. It may be convenient that the base film 105a is punched to be easily removed later. However, the metal wirings 110a and 120a are only removed to form the cutting line 150a.

Figure 4A:
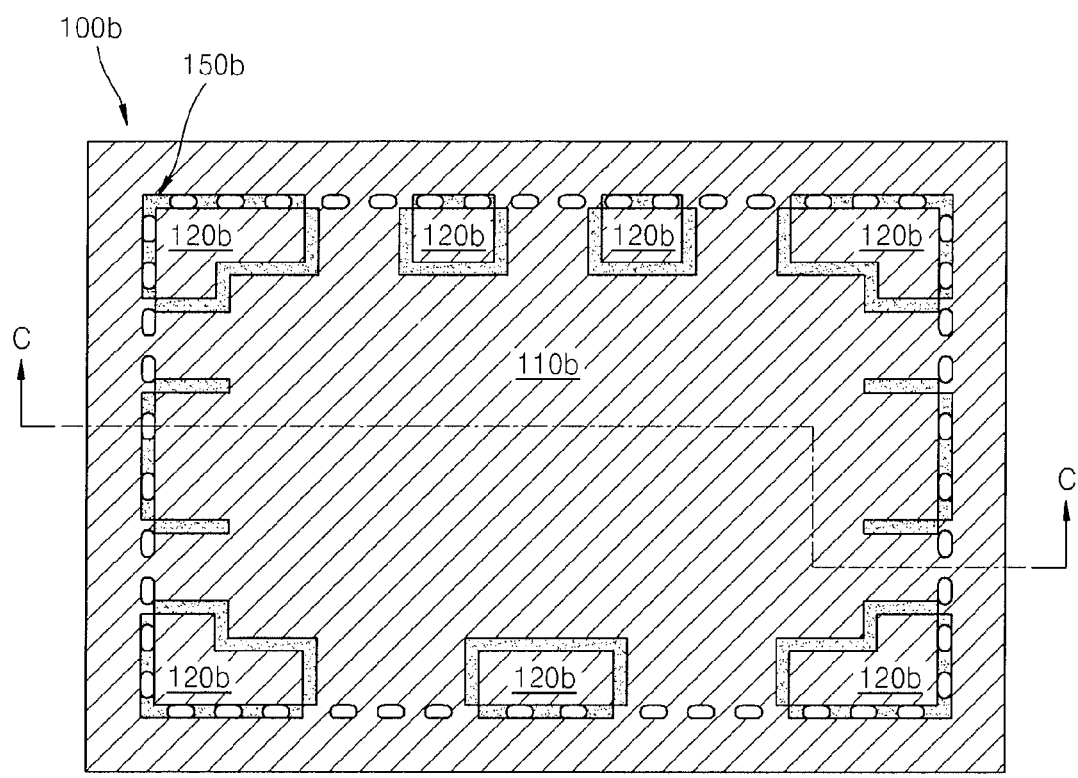
Figure 4B:
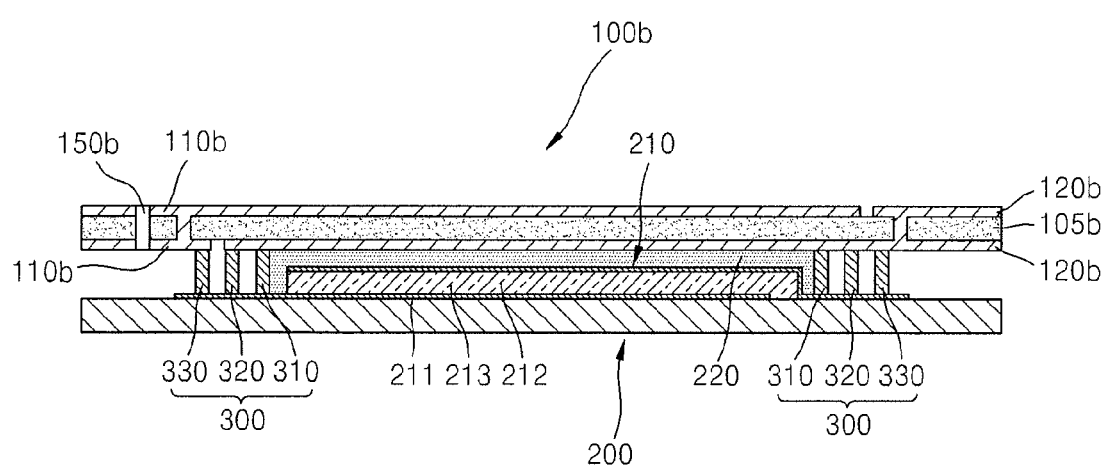

FIGS. 4A and 4B illustrate an encapsulation sheet 100b having another type of cutting line 150b. Like reference numerals in the previous embodiments denote like elements. The cutting line 150b does not completely remove metal wirings 110b and 120b along a corresponding location of the cutting line 150b, and instead removes the metal wirings 110b and 120b sparsely and partially punches both portions where the metal wirings 110b and 120b are removed and where the metal wirings 110b and 120b are not removed. That is, both the metal wirings 110b and 120b and a base film 105b are partially punched to form the cutting line 150b. As described above, the cutting line 105b may be formed in various forms.

Figure 5B:
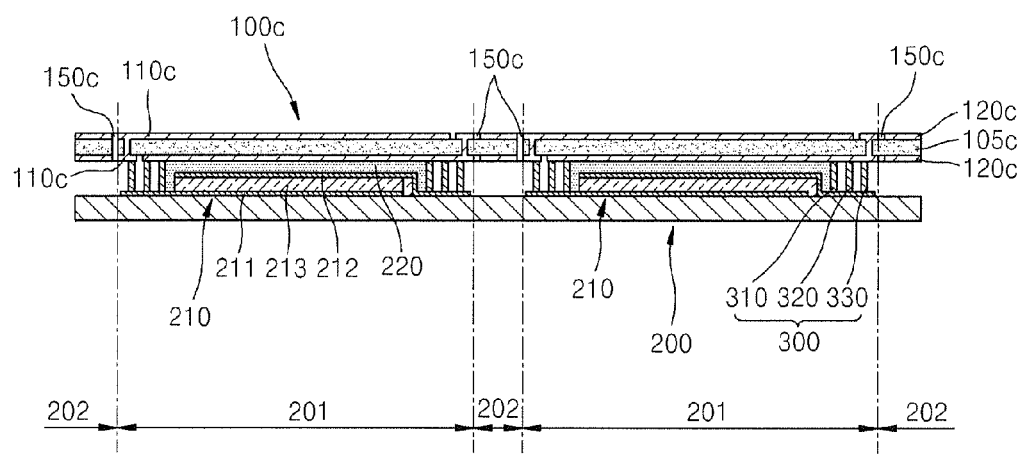

FIGS. 5A and 5B illustrate multi-cells, each in which a display unit 210 is formed on the substrate 200. That is, in the previous embodiments, a single cell including one display unit 210 is formed on one substrate 200. However, the manufacturing method according to the present invention may be applied to the manufacturing of multi-cells, in which a number of display units 210 are formed on one substrate 200 as in the current embodiment.

In this regard, an encapsulation sheet 100c may have substantially the same size as the substrate 200 including the multi-cells, and a cutting line 150c is formed to surround the display unit 210 of each unit cell. The cutting line 150c may selectively have the structure described in the above embodiments. Accordingly, the manufacturing method according to the embodiments of the present invention may be applied not only to a single cell but also to multi-cells.

As described above, in the method of manufacturing an organic light-emitting display apparatus, according to embodiments of the present invention, a step height is not generated between the substrate and the encapsulation sheet when cutting the substrate and thus cracks are hardly generated. Accordingly, products may be stably produced.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A method of manufacturing an organic light-emitting display apparatus, the method comprising:
preparing a substrate comprising a display unit and peripheral parts surrounding the display unit;
forming a cutting line on an encapsulation sheet to correspond to a boundary line between the display unit and the peripheral parts, wherein a size of the encapsulation sheet corresponds to that of the substrate;
adhering the substrate and the encapsulation sheet together;
removing the peripheral parts of the substrate; and
cutting the encapsulation sheet along the cutting line.

2. The method of claim 1, wherein the encapsulation sheet comprises an insulating base film and metal wirings on at least one surface of the base film so as to form a conductive path connecting the display unit and a power source.

3. The method of claim 2, wherein the metal wirings are completely removed at the cutting line and the base film is partially punched.

4. The method of claim 2, wherein the metal wirings are completely removed at the cutting line and the base film is not punched.

5. The method of claim 2, wherein the metal wirings and the base film are all partially punched at the cutting line.

6. The method of claim 2, wherein the substrate comprises a plurality of cells, each of the cells comprising the display unit and the cutting line surrounding the display unit.

7. The method of claim 1, wherein the substrate comprising the peripheral parts has the same size as that of the encapsulation sheet comprising the cutting line.

* * * * *